(12) United States Patent
Sandhu

(10) Patent No.: US 6,245,674 B1
(45) Date of Patent: *Jun. 12, 2001

(54) METHOD OF FORMING A METAL SILICIDE COMPRISING CONTACT OVER A SUBSTRATE

(75) Inventor: Gurtej S. Sandhu, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/260,233

(22) Filed: Mar. 1, 1999

(51) Int. Cl.[7] .................. H01L 21/4763; H01L 21/44; H01L 21/31

(52) U.S. Cl. ............... 438/674; 438/630; 438/639; 438/641; 438/655; 438/656; 438/675; 438/680; 438/682; 438/685; 438/775

(58) Field of Search ................... 438/637–641, 438/622, 629, 630, 648–649, 655–656, 674, 675, 680, 682, 685, 763, 761, 775

(56) References Cited

U.S. PATENT DOCUMENTS

| | | | |
|---|---|---|---|
| 5,173,327 | 12/1992 | Sandhu et al. | 427/573 |
| 5,296,404 | 3/1994 | Akabori et al. | 437/173 |
| 5,326,404 | 7/1994 | Sato | 118/723 |
| 5,344,792 | * 9/1994 | Sandhu et al. | 438/660 |
| 5,496,752 | 3/1996 | Nasu et al. | 437/41 |
| 5,510,146 | 4/1996 | Miyasaka | 427/255 |
| 5,529,937 | 6/1996 | Zhang et al. | 437/10 |
| 5,567,243 | 10/1996 | Foster et al. | 118/730 |
| 5,593,511 | 1/1997 | Foster et al. | 148/238 |
| 5,670,425 | * 9/1997 | Schinella et al. | 438/645 |
| 5,766,997 | 6/1998 | Takeuchi | 438/257 |
| 5,846,881 | * 12/1998 | Sandhu et al. | 438/683 |
| 5,926,737 | * 7/1999 | Ameen et al. | 438/649 |
| 5,930,671 | * 7/1999 | Ku | 438/630 |
| 5,975,912 | * 11/1999 | Hillman et al. | 437/245 |
| 5,976,976 | * 11/1999 | Doan et al. | 438/683 |

FOREIGN PATENT DOCUMENTS

| | | |
|---|---|---|
| 0 631 309 A2 | 12/1994 | (EP). |
| 0 631 309 A3 | 12/1994 | (EP). |
| WO 95/34092 | 12/1995 | (WO). |

OTHER PUBLICATIONS

A Bouteville, J.C. Remy and C. Attuyt, "TiSi$_2$ Selective Growth in a Rapid Thermal Low Pressure Chemical Vapor Deposition System", *J. Electrochem Soc.*, vol. 139, No. 8, Aug. 1992.

Murakami, S, et al., "Plasma–Nitridated Ti Contact System for VLSI Interconnections", *4th Internat. IEEE VLSI Multilevel Interconnection Conference*, Santa Clara CA, Jun. 15–16, 1987.

* cited by examiner

*Primary Examiner*—John F. Niebling
*Assistant Examiner*—Ha Tran Nguyen
(74) *Attorney, Agent, or Firm*—Wells, St. John, Roberts, Gregory & Matkin P.S.

(57) ABSTRACT

A method of forming a metal silicide comprising contact over a substrate includes forming an opening in an insulative material to a substrate region with which electrical connection is desired. The opening has insulative sidewalls. The insulative sidewalls within the opening are coated with an electrically conductive material. The coating less than completely fills the opening. An example process is to deposit an elemental metal or metal alloy layer, and then nitridize it. Preferably, the substrate region comprises silicon which reacts with the metal layer during deposition to form a silicide of the metal(s). A preferred deposition comprised forming a plasma from source gases comprising $TiCl_4$ and $H_2$. A metal silicide layer is then substantially chemical vapor deposited on the conductive coating and over the substrate region relative to any exposed insulative material to fill remaining volume of the opening with the metal silicide. The preferred substantially selective depositing comprises LPCVD, most preferably void of plasma, at a temperature of at least 650° C. comprising metal tetrahalide and $SiH_4$ comprising source gases.

31 Claims, 2 Drawing Sheets

METHOD OF FORMING A METAL SILICIDE COMPRISING CONTACT OVER A SUBSTRATE

TECHNICAL FIELD

This invention relates to methods of forming metal silicide comprising contacts over substrates.

BACKGROUND OF THE INVENTION

The invention primarily grew out of needs for making highly reliable, high density dynamic random access memory (DRAM) contacts. Advance semiconductor fabrication is employing increasing vertical circuit integration as designers continue to strive for circuit density maximization. Such typically includes multi-level metallization and interconnect schemes.

Electrical interconnect techniques typically require electrical connection between metal or other conductive layers, or regions, which are present at different elevations within the substrate. Such interconnecting is typically conducted, in part, by etching a contact opening through insulating material to the lower elevation of a layer or conductive region. The significant increase in density of memory cells and vertical integration places very stringent requirements for contact fabrication technology. The increase in circuit density has resulted in narrower and deeper electrical contact openings between layers within the substrate, something commonly referred to as increasing aspect ratio. Such currently ranges from 1.0 to 5, and is expected to increase. Further, the circuit density increase places increasing constraints on the conductivity of the contacts themselves.

As transistor active area dimensions approached one micron in diameter, conventional process parameters resulted in intolerable increased resistance between the active region or area and the conductive layer. The principal way of reducing such contact resistance is by formation of a metal silicide atop the active area prior to application of the conductive film for formation of the conductive runner. One common metal silicide material formed is $TiSi_x$, where x is predominantly "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially non-reactive, $SiO_2$ layer.

Ultimately, an electrically conductive contact filling material such as tungsten would be provided for making electrical connection to the contact. However, tungsten adheres poorly to $TiSi_x$. Additionally, it is desirable to prevent intermixing of the contact filling material with the silicide and underlying silicon. Accordingly, an intervening layer is typically provided to prevent the diffusion of the silicon and silicide with the plug filling metal, and to effectively adhere the plug filling metal to the underlying substrate. Such material is, accordingly, also electrically conductive and commonly referred to as a "barrier layer" due to the anti-diffusion properties.

One material of choice for use as a glue/diffusion barrier layer is titanium nitride. TiN is an attractive material as a contact diffusion barrier in silicon integrated circuits because it behaves as an impermeable barrier to silicon, and because the activation energy for the diffusion of other impurities is very high. TiN is also chemically thermodynamically very stable, and it exhibits typical low electrical resistivities of the transition metal carbides, borides, or nitrides.

TiN can be provided or formed on the substrate in one of the following manners: a) by evaporating Ti in an $N_2$ ambient; b) reactively sputtering Ti in an Ar and $N_2$ mixture; c) sputtering from a TiN target in an inert (Ar) ambient; d) sputter depositing Ti in an Ar ambient and converting it to TiN in a separate plasma nitridation step; or e) by low pressure chemical vapor deposition.

As device dimensions continue to shrink, adequate step coverage within the contact has become problematic with respect to certain deposition techniques. Chemical vapor deposition (CVD) is known to deposit highly conformal layers, and would be preferable for this reason in depositing into deep, narrow contacts. Yet, adequate contact coverage of electrically conductive materials ultimately placed within deep and narrow contacts continues to challenge the designer in assuring adequate electrical connection between different elevation areas within the substrate.

SUMMARY OF THE INVENTION

The invention comprises methods of forming metal silicide comprising contacts over substrates. In accordance with but one implementation, a method includes forming an opening in an insulative material to a substrate region with which electrical connection is desired. The opening has insulative sidewalls. The insulative sidewalls within the opening are coated with an electrically conductive material. The coating less than completely fills the opening. An example process is to deposit an elemental metal or metal alloy layer, and then nitridize it. Preferably, the substrate region comprises silicon which reacts with the metal layer during deposition to form a silicide of the metal(s). A preferred deposition comprises forming a plasma from source gases comprising $TiCl_4$ and $H_2$. A metal silicide layer is then substantially selectively chemical vapor deposited on the conductive coating and over the substrate region relative to any exposed insulative material to fill remaining volume of the opening with the metal silicide. The preferred substantially selective depositing comprises low pressure chemical vapor deposition (LPCVD), most preferably void of plasma, at a temperature of at least 650° C. comprising metal tetrahalide and $SiH_4$ source gases.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
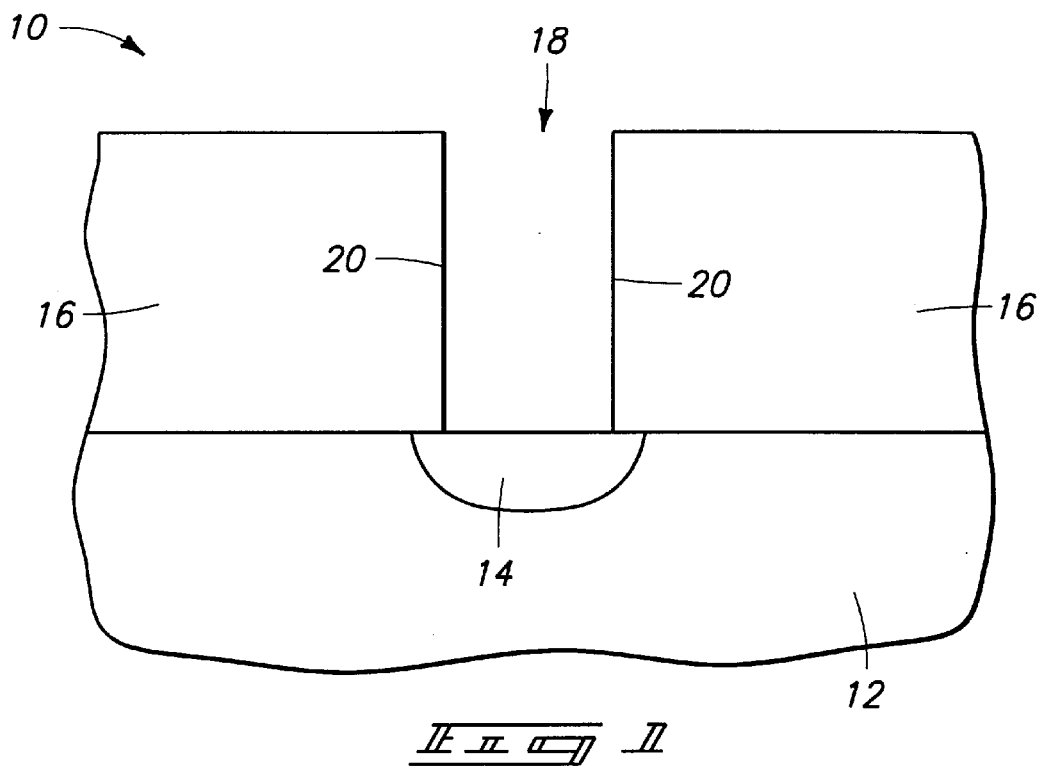
FIG. 1 is a diagrammatic sectional view of a semiconductor wafer fragment at one processing step in accordance with the invention.

Referring to FIG. 1, a semiconductor wafer fragment is indicated generally with reference numeral 10. Such comprises a bulk monocrystalline silicon substrate 12 having a conductively doped diffusion region 14 formed therein. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An insulative layer 16 is formed over substrate 12. Example materials include borophosphosilicate glass, undoped $SiO_2$, and $Si_3N_4$. An opening 18 is formed in insulative material 16 to substrate 12, and in this example to substrate region 14 with which electrical connection is desired. Alternate substrate regions are of course contemplated, such as outer surfaces of silicon comprising plugs, conductive metal or metal compound layers and the like. Preferably, the substrate region with which electrical connection in accordance with the invention is to be made comprises silicon, most preferably in an elemental form whether monocrystalline, polycrystalline or amorphous. Opening 18 has insulative sidewalls 20.

Figure 2:
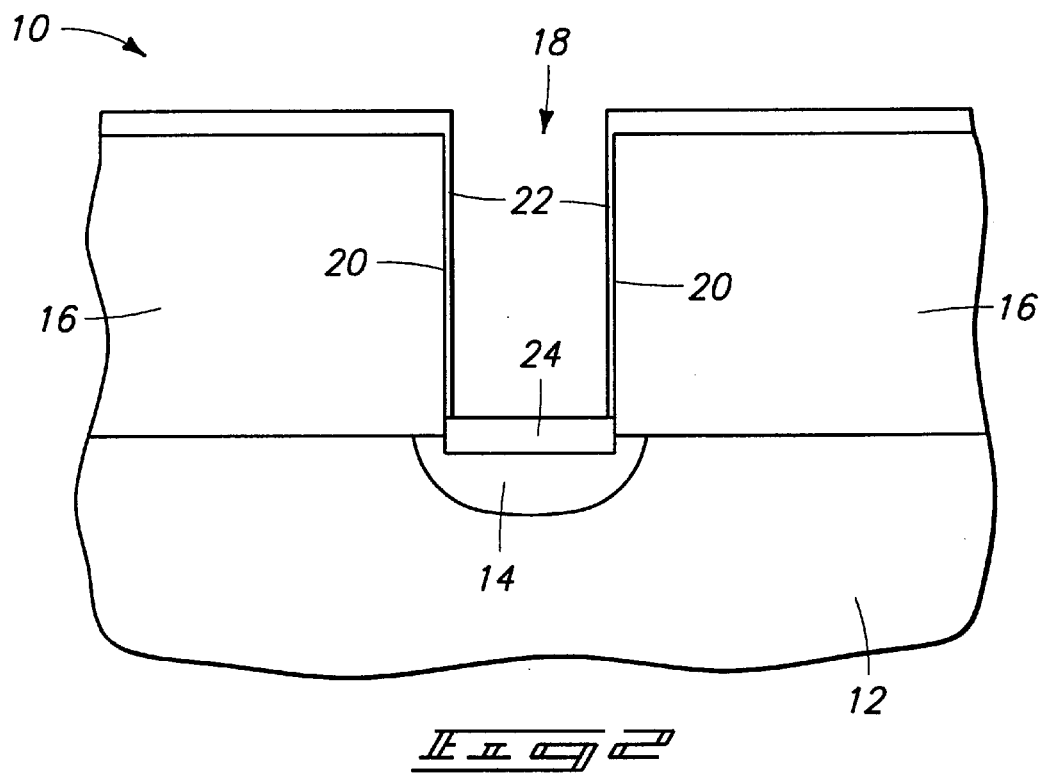
FIG. 2 is a view of the FIG. 1 wafer fragment at a processing step subsequent to that shown by FIG. 1.

The insulative sidewalls within the opening are coated with an electrically conductive material which less than completely fills the opening. For example referring to FIG. 2 in accordance with a preferred aspect of the invention, an elemental metal or metal alloy layer 22 is deposited over sidewalls 20. A preferred process for achieving the deposition of FIG. 2 comprises forming a plasma from source gases comprising a metal tetrahalide (i.e., $TiCl_4$) and $H_2$. Argon or other gases might be present, including a silicon comprising source gas, although silicon comprising source gases are preferably not utilized in this part of the process. Such plasma deposition process preferably forms a much thinner portion of metal layer 22 over insulative sidewalls 20 than over the illustrated outer/upper surfaces of material 16. An example and preferred thickness for that portion of layer 22 over sidewalls 20 is from about 10 Angstroms to about 100 Angstroms. Less than 100 Angstroms is most preferred for maximizing the volume of silicide to be deposited within the remaining volume of opening 18. Example processes for achieving the FIG. 2 deposition are as described in U.S. Pat. No. 5,173,327, which is hereby incorporated by reference. A specific example for achieving the deposition of FIG. 2 includes $TiCl_4$ flow at 100 sccm, $H_2$ flow at 5000 sccm, Ar flow at 5000 sccm, RF Power at 500W, pressure at 5 Torr, and temperature at 650° C.

The deposition conditions are preferably chosen to be effective for the depositing titanium to form a titanium silicide region 24 from reaction with the silicon comprising substrate region, in this example at the base of the opening and thereby in electrical connection with region 14. Thus, and in accordance with but one example, metal layer 22 is formed in electrical connection with substrate region through metal compound region 24. Generally, depositions at temperatures greater than or equal to about 500° C. will result in in situ formation of silicide with the substrate during deposition.

Then, preferably at least the outer surfaces of metal layer 22 and metal silicide region 24 are nitridized to transform at least the outer portions thereof into a metal nitride (not specifically designated in the figures). The nitridation is more preferably conducted to be sufficiently complete to transform all of that portion of metal layer 22 over insulative sidewalls 20 into a metal nitride, but only the outermost portions of silicide layer 24 to metal nitride to leave a suicide contact interface to region 14. Most preferably, the nitridizing comprises exposing the outer surfaces of metal layer 22 and metal silicide region 24 to a nitrogen atom containing plasma. A preferred example includes a mixture of hydrogen and nitrogen which is ideally void of any separate titanium component (i.e., void of $TiCl_4$). A preferred specific example plasma treatment is to utilize hydrogen in the form $H_2$ gas and nitrogen in the form of $N_2$ gas at a volumetric feed ratio to a plasma enhanced chemical vapor deposition (PECVD) reactor of $N_2$ to $H_2$ of from about 2.25:1 to about 4:1. Subatmospheric pressure of from 1 Torr to 10 Torr and a temperature of greater than or equal to about 600° C. are also preferred. An example RF plasma power is 250 W for a single wafer reactor. Alternately or in addition thereto, the hydrogen and nitrogen provided for such preferred treatment can be from a single molecular gas, such as $NH_3$.

The above comprises but one example of coating insulative sidewalls 20 within opening 18 with an electrically conductive material. In the preferred example, such comprises a metal compound, although the coating could consist essentially of an elemental metal or metal alloy, or other conductive materials. A metal compound is preferred, such as TiN to take advantage of its known adhesion and barrier properties. Further in some instances, such a layer can act as a barrier against corrosion by CVD chemistries which might be utilized to deposit a silicide layer subsequently. Metal compound layers could also, of course, be provided within opening 18 to coat insulative sidewalls 20 by other manners, such as chemical vapor deposition and other techniques. Most preferred and effective results were achieved, however, utilizing a silicon comprising substrate region and depositing elemental titanium and subsequently transforming it using plasma to a titanium nitride layer. Layer 22 at this point in the process can remain or be removed from the outermost surface of insulative material layer 16.

Figure 3:
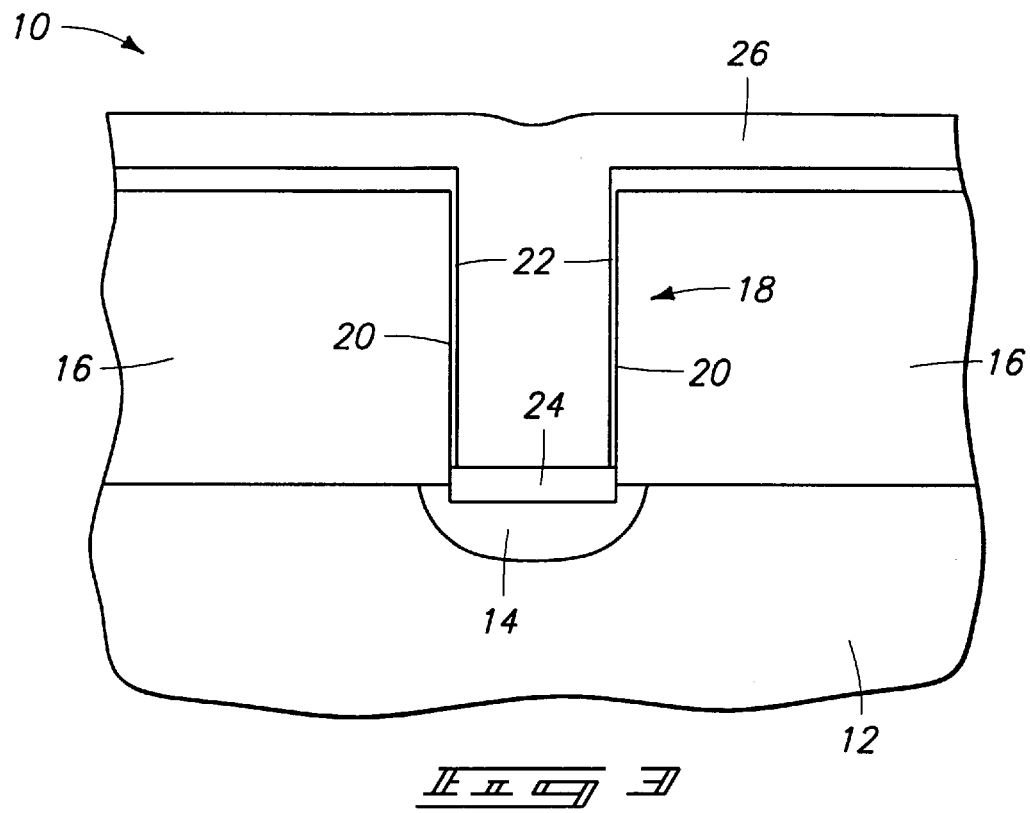
FIG. 3 is a view of the FIG. 1 wafer fragment at a processing step subsequent to that shown by FIG. 2.

Referring to FIG. 3, a metal silicide layer 26 is deposited over metal and/or metal nitride layer 22 substantially selectively relative to any exposed insulative material to fill the remaining volume of opening 18 with silicide. In the context of this document, "substantially selective" means a deposition ratio of at least 2:1 A preferred process is low pressure chemical vapor deposition at a temperature of least 650° C. comprising metal tetrahalide and $SiH_4$ source gases. An example preferred metal tetrahalide is $TiCl_4$. The silicon source gas can be organic and inorganic. Example inorganic source gases include silane, disilane, etc. Example organic silicon source gases comprise methlysilane and the like. $H_2$, Ar, and other gases can also of course be added. The substantially selective deposition is preferably not plasma enhanced, which facilitates or enhances the selectivity. For $SiH_4$, a preferred temperature range for the selective deposition is from 650° C. to 900° C., with a preferred pressure range being from 10 mTorr to 10 Torr. A specific example is at 775° C. and 200 mTorr. A specific example involving silane and $TiCl_4$ flows includes feeding pure $TiCl_4$ and a mixture of 10% by volume silane in a helium carrier gas. A preferred range of flow ratios of such gases of the silane mixture and $TiCl_4$ is from 20:1 to 100:1 by volume, thus providing a ratio of the silicon comprising compound silane in a ratio of from 2:1 to 10:1 by volume as compared to $TiCl_4$. A preferred specific example is a 5:1 ratio. Selective deposition whereby the silicide deposits on conductive surfaces and not insulative surfaces has been reduced to practice and demonstrated on tungsten and silicon surfaces, with deposition not occurring on BPSG, undoped $SiO_2$, and $Si_3N_4$ layers. Selective deposition ratios in excess of 1000:1 have been demonstrated using $TiCl_4$ and silane over titanium nitride and titanium silicide.

Prior substantially selective CVD of titanium silicide within insulative material contact openings has been conducted by Applicant as described above where the sidewalls were not coated with conductive material. Yet the substantially selective nature of the deposition resulted in unacceptably slow silicide growth within the contact opening, particularly where the selectivity in the deposition is greatest. Coating the sidewalls with a conductive material in advance of the selective silicide deposition can significantly reduce the deposition time.

The substantially selective capable depositing can occur where there is exposed insulative material during such depositing, as well as if there were no exposed insulative material during the depositing. By way of example only and not of limitation, the deposition of FIG. 3 might be conducted where there are other exposed insulative surfaces on the wafer displaced from the depicted fragment, or such would occur if layer 22 were removed outwardly of the outermost surface of insulative material layer 16 prior to the deposit of layer 26 (not shown).

Figure 4:
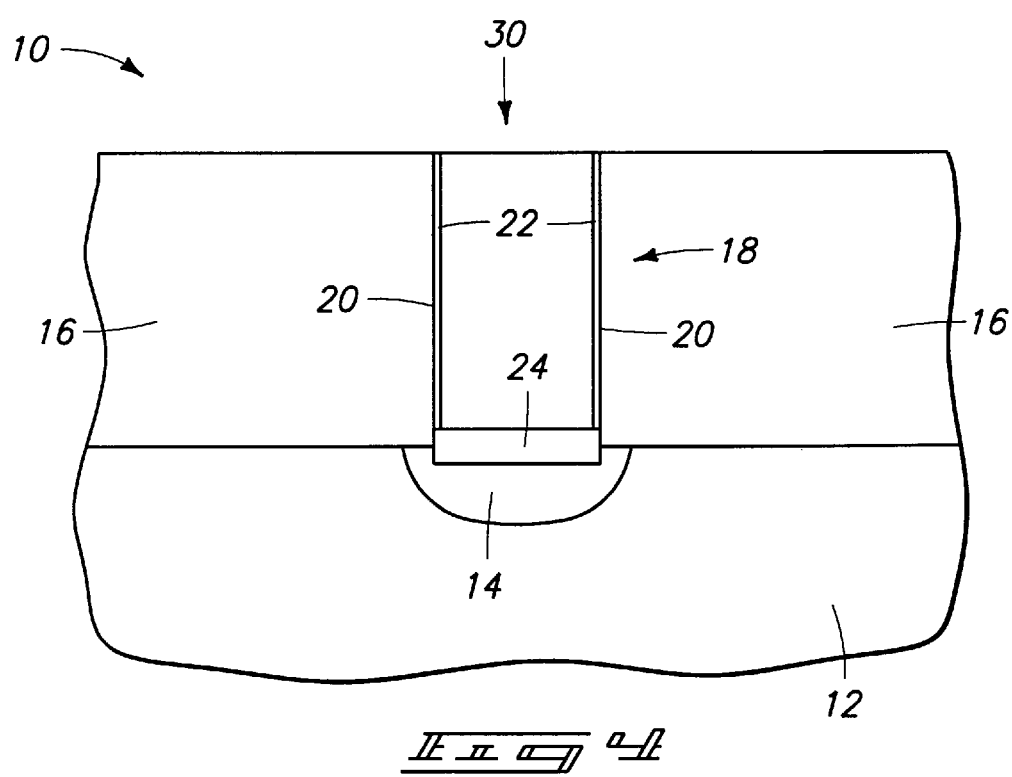
FIG. 4 is a view of the FIG. 1 wafer fragment at a processing step subsequent to that shown by FIG. 3.

Referring to FIG. 4, exemplary subsequent processing is depicted whereby layers 26 and 22 outwardly of the outermost surface of insulative material layer 16 have been removed or otherwise planarized back to form an isolated metal silicide comprising contact plug 30 within what was formerly opening 18. Layers 26 and 22 outwardly of layer 16 could alternately be patterned or utilized as a conductive device component. Such would include by way of example only, a conductive line, a capacitor plate or other conductive component of a device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a metal silicide comprising contact over a substrate comprising:
   forming an opening in an insulative material to a substrate region with which electrical connection is desired, the opening having insulative sidewalls;
   coating portions of the insulative sidewalls within the opening with an electrically conductive material selected from the group consisting of a metal compound other than a metal silicide, an elemental metal, a metal alloy, and mixtures thereof, the coating less than completely filling the opening; and
   substantially selectively chemical vapor depositing a metal silicide on the conductive coating and over the substrate region relative to any exposed insulative material to fill remaining volume of the opening with the metal silicide, wherein there is no exposed insulative material during the substantially selective depositing.

2. The method of claim 1 wherein the electrically conductive material consists essentially of an elemental metal or a metal alloy.

3. The method of claim 1 wherein the coating comprises depositing an elemental metal layer over the sidewalls and transforming the metal layer to a metal compound prior to the chemical vapor depositing.

4. The method of claim 3 wherein the elemental layer depositing comprises PECVD, and the substantially selective depositing is not plasma enhanced.

5. The method of claim 1 wherein the substrate region comprises silicon of a bulk monocrystalline silicon substrate.

6. The method of claim 1 wherein there is exposed insulative material during the substantially selective depositing.

7. The method of claim 1 wherein the substantially selective depositing is not plasma enhanced.

8. The method of claim 7 wherein the substantially selective depositing comprises LPCVD at a temperature of at least 700° C. comprising metal tetrahalide and $SiH_4$ source gases.

9. The method of claim 1 wherein the coating is formed to have a thickness no greater than about 100 Angstroms.

10. The method of claim 1 wherein the coating is formed to have a thickness from about 10 Angstroms to about 100 Angstroms.

11. A method of forming a metal silicide comprising contact over a substrate comprising:
    forming an opening in an insulative material to a silicon comprising substrate region with which electrical connection is desired, the opening having insulative sidewalls;
    depositing an elemental metal or a metal alloy layer within the opening over portions of the insulative sidewalls and the substrate region, the metal layer being reacted with silicon of the substrate region and forming a metal silicide within the opening in electrical connection with the region;
    nitridizing at least outer surfaces of the metal layer and the metal silicide to form a metal nitride layer, wherein the nitridizing is effective to transform all of the metal layer within the opening to metal nitride, but only an outer portion of the metal suicide to metal nitride; and
    substantially selectively depositing a silicide of the metal over the metal nitride layer relative to any exposed insulative material to fill remaining volume of the opening with silicide.

12. The method of claim 11 wherein the metal layer consists essentially of titanium, the metal silicide comprises titanium silicide, and the metal nitride layer comprises titanium nitride.

13. A method of forming a metal silicide comprising contact over a substrate comprising:
    forming an opening in an insulative material to a silicon comprising substrate region with which electrical connection is desired, the opening having insulative sidewalls;
    depositing an elemental metal or a metal alloy layer within the opening over portions of the insulative sidewalls and the substrate region, the metal layer being reacted with silicon of the substrate region and forming a metal silicide within the opening in electrical connection with the region;
    nitridizing at least outer surfaces of the metal layer and the metal silicide to form a metal nitride layer; and
    substantially selectively depositing a suicide of the metal over the metal nitride layer relative to any exposed insulative material to fill remaining volume of the opening with silicide, wherein there is no exposed insulative material during the substantially selective depositing.

14. The method of claim 11 wherein the metal layer depositing comprises PECVD, and the substantially selective depositing is not plasma enhanced.

15. The method of claim 11 wherein the nitridizing comprises exposing the outer surfaces of the metal layer and the metal silicide layer to a nitrogen atom containing plasma.

16. The method of claim 11 wherein the substantially selective depositing is not plasma enhanced.

17. The method of claim 16 wherein the substantially selective depositing comprises LPCVD at a temperature of at least 650° C. comprising metal tetrahalide and $SiH_4$ source gases.

18. The method of claim 11 wherein the silicon comprising substrate region comprises a bulk monocrystalline silicon substrate.

19. The method of claim 11 comprising forming the metal nitride layer to have a thickness no greater than about 100 Angstroms.

20. The method of claim 11 comprising forming the metal nitride layer to have a thickness between about 10 Angstroms and about 100 Angstroms.

21. A method of forming a metal suicide comprising contact over a substrate comprising:

forming an opening in an insulative material to a substrate region with which electrical connection is desired, the opening having insulative sidewalls;

forming an elemental metal or metal alloy layer within the opening over portions of the insulative sidewalls and in electrical connection with the substrate region, the metal layer less than completely filling the opening; and substantially selectively chemical vapor depositing a metal silicide over the metal layer relative to any exposed insulative material to fill remaining volume of the opening with the metal silicide, wherein there is no exposed insulative material during the substantially selective depositing.

22. The method of claim 21 comprising nitridizing the metal layer prior to the chemical vapor deposit of the metal silicide.

23. The method of claim 21 comprising forming the metal layer to be in electrical connection with the substrate region through a metal compound layer.

24. The method of claim 21 wherein the metal layer forming comprises PECVD, and the substantially selective depositing is not plasma enhanced.

25. The method of claim 21 wherein the substantially selective depositing is not plasma enhanced.

26. The method of claim 25 wherein the substantially selective depositing comprises LPCVD at a temperature of at least 650° C. comprising metal tetrahalide and $SiH_4$ source gases.

27. A method of forming a metal suicide comprising contact over a substrate comprising:

forming an opening in an insulative material to a silicon comprising substrate region with which electrical connection is desired, the opening having insulative sidewalls;

depositing an elemental metal or metal alloy layer within the opening over portions of the insulative sidewalls and the substrate region, the metal layer being reacted with silicon of the region and forming a metal silicide within the opening in electrical connection with the region; and substantially selectively chemical vapor depositing a silicide of the metal over the metal layer relative to any exposed insulative material to fill remaining volume of the opening with silicide, wherein there is no exposed insulative material during the substantially selective depositing.

28. The method of claim 27 comprising nitridizing the metal layer prior to the chemical vapor deposit of the metal silicide.

29. The method of claim 27 wherein the metal layer depositing comprises PECVD, and the substantially selective depositing is not plasma enhanced.

30. The method of claim 27 wherein the substantially selective depositing is not plasma enhanced.

31. The method of claim 30 wherein the substantially selective depositing comprises LPCVD at a temperature of at least 700° C. comprising metal tetrahalide and silicon comprising source gases.

* * * * *

UNITED STATES PATENT AND TRADEMARK OFFICE
CERTIFICATE OF CORRECTION

PATENT NO.    : 6,245,674 B1
DATED         : June 12, 2001
INVENTOR(S)   : Gurtej S. Sandhu It is certified that error appears in the above-identified patent and that said Letters Patent is hereby corrected as shown below:

Column 4,
Line 3, replace "leave a suicide" with -- leave a silicide --.

Column 6,
Line 41, replace "suicide" with -- silicide --.
Line 65, replace "suicide" with -- silicide --.

Column 7,
Line 25, replace "suicide" with -- silicide --.

Column 8,
Line 12, replace "suicide" with -- silicide --.

Signed and Sealed this

Fifteenth Day of January, 2002

*Attest:*

JAMES E. ROGAN
*Attesting Officer*   *Director of the United States Patent and Trademark Office*